(12) United States Patent
Yasuta et al.

(10) Patent No.: US 11,428,727 B2
(45) Date of Patent: Aug. 30, 2022

(54) PROBER

(71) Applicant: KABUSHIKI KAISHA NIHON MICRONICS, Tokyo (JP)

(72) Inventors: Katsuo Yasuta, Tokyo (JP); Mamoru Aruga, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 0 days.

(21) Appl. No.: 17/044,242

(22) PCT Filed: Mar. 25, 2019

(86) PCT No.: PCT/JP2019/012536
§ 371 (c)(1),
(2) Date: Sep. 30, 2020

(87) PCT Pub. No.: WO2019/188999
PCT Pub. Date: Oct. 3, 2019

(65) Prior Publication Data
US 2021/0156901 A1 May 27, 2021

(30) Foreign Application Priority Data

Mar. 30, 2018 (JP) .............................. JP2018-069082

(51) Int. Cl.
*G01R 31/26* (2020.01)
*G01R 1/073* (2006.01)

(52) U.S. Cl.
CPC ..... *G01R 31/2601* (2013.01); *G01R 1/07307* (2013.01)

(58) Field of Classification Search
CPC .......................... G01R 1/07307; G01R 31/2601
See application file for complete search history.

(56) References Cited

U.S. PATENT DOCUMENTS 6,194,907 B1 2/2001 Kanao et al.
6,559,668 B1 * 5/2003 Tervo ..................... G01R 1/067
324/756.03

(Continued)

FOREIGN PATENT DOCUMENTS

JP H784003 A 3/1995
JP 2000183120 A 6/2000

(Continued)

OTHER PUBLICATIONS

English Translation of JP 2004-309257 A (Year: 2004).*

*Primary Examiner* — Paresh Patel
(74) *Attorney, Agent, or Firm* — Browdy and Neimark, P.L.L.C.

(57) ABSTRACT

An object of the present invention is to provide a prober that is able to carry out accurate inspection of semiconductor device in wafer state by reducing the effect of the external noises and the leakage of current and further by eliminating the stray capacitance of the chuck stage against the prober housing. The present invention attains this object by providing a prober comprising a chuck cover conductor that comprises a bottom conductor and a side conductor and an open top, wherein a chuck stage can be contained within a space surrounded by the bottom conductor and the side conductor; an upper cover conductor which has opening through which the conducting support members of the probe for front-side electrodes and the probe for back-side electrodes can be passed, and which is large enough to cover, in a plane view, at least the open top of the chuck cover conductor when the contact member of the probe for front-side electrodes moves relatively within a wafer under inspection; and, a conducting means that brings the chuck cover conductor and the upper cover conductor into contact and makes them electrically continuous.

10 Claims, 9 Drawing Sheets

(56) References Cited

U.S. PATENT DOCUMENTS

| | | | |
|---|---|---|---|
| 7,295,025 B2* | 11/2007 | Lesher | G01R 19/0053 |
| | | | 324/756.03 |
| 2002/0075027 A1* | 6/2002 | Hollman | G01R 1/18 |
| | | | 324/756.01 |
| 2005/0110508 A1 | 5/2005 | Kishida | |
| 2010/0033199 A1 | 2/2010 | Komatsu et al. | |
| 2013/0141127 A1 | 6/2013 | Yasuta et al. | |
| 2013/0141132 A1 | 6/2013 | Yasuta et al. | |
| 2015/0015285 A1 | 1/2015 | Shinohara et al. | |
| 2017/0292974 A1 | 10/2017 | Teich et al. | |

FOREIGN PATENT DOCUMENTS

| | | |
|---|---|---|
| JP | 200343079 A | 2/2003 |
| JP | 2004309257 A | 11/2004 |
| JP | 2005156253 A | 6/2005 |
| JP | 200740926 A | 2/2007 |
| JP | 2008101944 A | 5/2008 |
| JP | 2013117476 A | 6/2013 |
| JP | 2013118320 A | 6/2013 |
| JP | 201535577 A | 2/2015 |

* cited by examiner

PROBER

TECHNICAL FIELD

The present invention relates to a prober, and, more particularly, to a prober used when inspecting the electrical characteristics of semiconductor devices, which have electrodes on both sides of a wafer substrate, in wafer state.

BACKGROUND ART

Power semiconductor devices such as power transistors, power MOSFETs, and IGBTs (Insulated Gate Bipolar Transistors), and semiconductor devices such as LEDs and semiconductor lasers sometimes have electrodes on the both sides of a wafer substrate so that electric current flows vertically through the chips. In order to inspect the electrical characteristics of such semiconductor devices in wafer state, a configuration that is able to have an electrical connection to both the front side and back side of a wafer is necessary. Accordingly, various types of prober have been proposed in order to achieve a prober that is able to bring a measurement probe into contact with the front side of semiconductor device under inspection, while having an electrode in contact with the back side of the semiconductor device.

An example of a configuration that is able to have an electrical connection to both the front side and back side of a wafer, may be a configuration, in which a probe that contacts each front-side electrode of semiconductor devices is equipped on the side facing the front side of a wafer while a chuck stage, at least the top surface of which is conductive, is arranged on the side facing the back side of a wafer. When inspection is carried out using this configuration, a wafer to be inspected is placed on the chuck stage and then the whole top surface of the chuck stage is used as an electrode that contacts with back-side electrodes of all semiconductor devices manufactured on the wafer.

However, when using such a configuration, it is necessary to move the chuck stage with respect to the probe arranged above the chuck stage in order to inspect all semiconductor devices formed on a wafer sequentially, which makes it inevitable to use a lengthy cable connecting the chuck stage and measurement device. When the length of the cable connecting the measurement device and the chuck stage that is used as an electrode contacting the back side of a wafer becomes longer, parasitic inductance of measurement path comprising the cable becomes larger, which makes it difficult to obtain transient characteristics necessary to carry out dynamic characteristics test and large current test close to the actual performance of the semiconductor devices under inspection. Therefore, even in the semiconductor devices that pass an inspection in wafer state, characteristics failure is sometimes found later in the final full-spec inspections, which is conducted after bonding, molding, and burn-in processes. If characteristic failure is found in the final full-spec inspections, all the processes carried out after the inspector in wafer state are wasted, causing the unfavorable increase in the product cost and the amount of wastes.

On the other hand, the Patent Literatures 1 and 2 disclose probers, in which a semiconductor device to be inspected is placed on the conductive base that is larger than the semiconductor device, and then probes for front-side electrodes are brought into contact with front surface of the semiconductor device, while probes for back-side electrodes are brought into contact with the conductive base at its exposed part above which the semiconductor device is not placed. However, the probers disclosed in the Patent Literatures 1 and 2 are not a prober which inspects semiconductor devices in wafer state, but a prober which inspects a semiconductor device that exists individually. These literatures provide no suggestions about how to accurately measure the characteristics of semiconductor devices having electrodes on both front and back sides in wafer state.

In view of the above-mentioned background, the present applicant proposed in the Patent Literature 3 a prober as an inspection apparatus that inspects semiconductor devices in wafer state, which comprises a wafer holding area which holds a wafer to be inspected and a probe contact area which is almost as large as the wafer holding area provided on the upper surface of the chuck stage, wherein the wafer holding area and the probe contact area are electrically continuous, and wherein the probe for front side electrodes and the probe for back side electrodes are placed above the chuck stage and at a certain distance apart in horizontal direction.

According to this prober, even when the probe for front side electrodes moves relatively within the wafer under inspection with the movement of the chuck stage, the probe for back side electrodes also moves relatively within the probe contact area while keeping the certain distance from the probe for front side electrodes. Therefore, the path length of the electrical connection path between the measurement device and the probe for front side electrodes and the probe for back side electrodes is always kept constant and shortest, which is very advantageous as it minimizes the parasitic inductance generated in the measurement path and makes it possible to obtain transient characteristics necessary to carry out dynamic characteristics test and large current test close to the actual performance of the semiconductor device under inspection.

PRIOR ART LITERATURE

Patent Literature

Patent Literature 1: Japanese Patent Kokai No. 2007-40926
Patent Literature 2: Japanese Patent Kokai No. 2008-101944
Patent Literature 3: Japanese Patent Kokai No. 2013-118320

DISCLOSURE OF INVENTION

Object of the Invention

The prober, which is previously proposed by the present applicant in the Patent Literature 3, has excellent advantages as described above. However, the subsequent investigation by the present inventors revealed that even the prober described above sometimes experiences the external noises and the leakage of current through the chuck stage, potentially causing errors especially in the microcurrent measurement. Furthermore, the measurement error sometimes becomes large when measuring capacitance, because of stray capacitance that is generated between the chuck stage and the prober housing that is usually grounded.

The present invention was made to further improve the prober previously proposed by the present applicant in the Patent Literature 3. An object of the present invention is to provide a prober that is able to carry out an accurate inspection of the semiconductor device in wafer state, by reducing the effect of the external noises and the leakage of current through the chuck stage and also by eliminating the stray capacitance of the chuck stage against the prober housing, while keeping advantageous features of the above-described prober that the parasitic inductance generated in the measurement path can be minimized by always keeping the constant and shortest length of the electrical connection path between the measurement device and the probe for front side electrodes and the probe for back side electrodes.

Means to Attain the Object

The present inventors made a continued research effort to attain the above object and ultimately found that a guard or shield made of conductor that surrounds the chuck stage with a minimum connection path can be formed, by placing the chuck stage inside a chuck cover conductor comprising a bottom conductor and a side conductor and having an open top, covering the open top of the chuck cover conductor with an upper cover conductor from upper side of the chuck stage, and then bringing the chuck cover conductor and the upper cover conductor in contact and make them electrically continuous when probing is carried out.

The present invention attains the above-mentioned object by providing a prober which comprises the following (1) to (7);

(1) a chuck stage that comprises a conductive wafer holding area and a conductive probe contact area on the upper side of the chuck stage, wherein the conductive probe contact area is electrically continuous with the wafer holding area;

(2) a probe for front-side electrodes and a probe for back-side electrodes placed above the upper surface of the chuck stage, each of which comprises a conducting support member and a contacting member that is electrically connected to the conducting support member;

(3) an inductance cancel bar, which is a conductive bar that connects between the conducting support member and the contacting member of the probe for front-side electrodes or between the supporting conductive member and the contacting member of the probe for back-side electrodes, placed parallel to the upper surface of the chuck stage;

(4) a moving means that moves the chuck stage relative to the probe for front-side electrodes and the probe for back-side electrodes;

(5) a chuck cover conductor that comprises a bottom conductor and a side conductor and an open top, wherein the chuck stage can be contained within a space surrounded by the bottom conductor and the side conductor;

(6) an upper cover conductor, which is placed above the inductance cancel bar, which has an opening through which the conducting support members of the probe for front-side electrodes and the probe for back-side electrodes or electrical connection lines connected to the probe for front-side electrodes and the probe for back-side electrodes can be passed, and which is large enough to cover, in a plane view, at least the open top of the chuck cover conductor when the contact member of the probe for front-side electrodes moves relatively within a wafer under inspection by the moving means during inspection; and, (7) a conducting means that brings the chuck cover conductor and the upper cover conductor into contact and makes them electrically continuous.

According to the prober of the present invention, the chuck stage comprising the wafer holding area and the probe contact area can be surrounded by the chuck cover conductor and the upper cover conductor which are electrically continuous, during inspection, as described above. Accordingly, for example, by placing the upper cover conductor at the same electric potential as that of the chuck stage, the chuck cover conductor and the upper cover conductor can function as a guard or shield, thereby reducing influence of external noises, leakage of the current through the chuck stage, and stray capacitance of the chuck stage against the prober housing. Thus, the prober of the present invention is advantageous in that it enables the more accurate inspection of the electrical characteristics of semiconductor elements, and the capacitance measurement of vertical semiconductor devices, which uses the chuck stage as a measurement terminal, with a smaller measurement error.

In a preferred embodiment of the prober of the present invention, the conducting support member of the probe for back-side electrodes has, around its surroundings, an outer conductor having the conducting support member as an inner conductor, wherein the outer conductor is electrically continuous with the upper cover conductor. As mentioned above, in the prober assumed in the present invention, the length of the electrical connection path between the measurement device and the probe for back-side electrodes is always kept constant and minimized, because the probe for back-side electrodes can relatively move within the probe contact area while keeping a constant distance from the probe for front-side electrodes, even when the contacting member of the probe for front-side electrodes relatively moves within a wafer under inspection by the movement of the chuck stage. Therefore, there is an advantage that the necessary electric potential can be provided to the upper cover conductor and the chuck cover conductor that is in the electrically continuous state with the upper cover conductor via the electrical connection path that always has the minimum required length, by making the upper cover conductor electrically continuous with the outer conductor that has the conducting support member of the probe for back-side electrodes as an inner conductor.

In a preferred embodiment of the prober of the present invention, the moving means that moves the chuck stage relative to the probe for front-side electrodes and the probe for back-side electrodes, also serves as the conducing means that brings the chuck cover conductor and the upper cover conductor into contact and makes them electrically continuous. The chuck cover conductor is usually placed on the moving means on which the chuck stage is also placed. Accordingly, when the chuck stage is relatively moved upwards or downwards by the moving means, the chuck cover conductor also moves upwards or downwards in the same manner and contacts the bottom of the upper cover conductor at the top edge of the side conductor, and, as a result, the chuck cover conductor and the upper cover conductor become electrically continuous.

In a preferred embodiment, the chuck cover conductor comprises a contactor at the upper part of the side conductor that contacts the upper cover conductor, wherein the contactor is elastically energized towards the upper cover conductor when in contact with the upper cover conductor. The contactor can have any structures as long as the contactor is conductive and can be elastically energized towards the upper cover conductor when in contact with the upper cover conductor. For example, a pogo pin comprising an end part that is energized by a spring in an expandable and retractable manner may be used as the contactor. An appropriately curved plate-shaped member composed of elastic and conductive materials may also be used as the contactor.

In a preferred embodiment of the prober of the present invention, the contacting member of the probe for front-side electrodes or the probe for back side-electrodes, which comprises the inductance cancel bar between the contacting member and the conducting support member, is supported to the upper cover conductor by an insulator between the contacting member and the upper cover conductor. Namely, when the contacting member is connected to the conducting support member through the inductance cancel bar, they form a cantilever structure, wherein the contact member and the inductance cancel bar are supported only at the position connected to the supporting contacting member. Such a cantilever structure may experience up and down vibration of the contact member due to the external vibration or the downward misalignment of the contact member due to its own weight, however, when at least the contacting member is supported to the upper cover conductor by an insulator between the contacting member and the upper cover conductor, the unstable cantilever structure can be avoided and it becomes possible to hold the edge of the contact member reliably at the predetermined height.

Furthermore, in a preferred embodiment of the prober of the present invention, the prober comprises multiple lift pins that lift up a wafer, and a lift pin driving means that moves the lift pins upwards or downwards in a space between the position below the wafer holding area of the chuck stage and the position above the top edge of the side conductor of the chuck cover conductor. Thereby, a wafer to be inspected can be easily placed on the wafer holding area or a wafer after inspection can be easily conveyed to the outside using a common wafer exchange device, while keeping the chuck stage contained within the chuck cover conductor comprising the bottom conductor and the side conductor. It is needless to say that the chuck stage has lift pin holes which the lift pin passes through.

Effect of the Invention

According to the prober of the present invention, the chuck stage, which comprises the wafer holding area and the probe contact area, the inductance cancel bar, which is placed in parallel to the top of the chuck stage, and the contacting member connected to the inductance cancel bar can be covered by the chuck cover conductor and the upper cover conductor, during inspection. Therefore, it provides the advantages that it enables the accurate inspection of the electrical characteristics of semiconductor devices formed on a wafer by reducing the influence of the external noises and the current leakage. In addition, because the chuck stage can be covered by the chuck cover conductor and the upper cover conductor, the stary capacitance of the chuck stage against the prober housing can be eliminated, making it possible to accurately measure the capacitance of semiconductor devices formed on a wafer using the chuck stage as a measurement terminal.

Furthermore, according to the prober of the present invention, necessary electric potential can be supplied to the upper cover conductor through the outer conductor that has the supporting conducing member of the probe for back-side electrodes as an inner conductor, and further, the electric potential can be supplied to the chuck cover conductor by bringing the chuck cover conductor and the upper cover conductor into contact and making them electrically continuous. Accordingly, the length of the electrical connection path that is used to provide an electric potential to the chuck cover conductor and the upper cover conductor, which works as a guard or shield, can be made very small. The prober of the present invention is very advantageous in that a guard or shield that surrounds the chuck stage can be formed, while minimizing the stray capacitance originated from the electrical connection path.

MODE FOR CARRYING OUT THE INVENTION

Hereinafter, the present invention is described with reference to the drawings, but it is needless to say that the prober of the present invention is not limited to the illustrated example.

Figure 1:
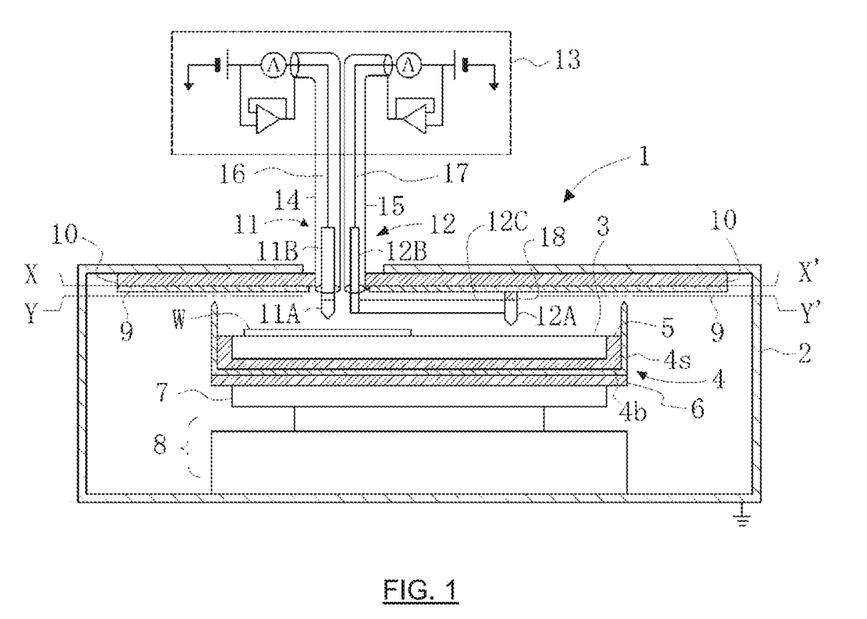
FIG. 1 is a partial cross section of a front view of an example of a prober of the present invention.

FIG. 1 is a partial cross section of a front view of an embodiment of a prober according to the present invention. In FIG. 1, the reference numeral 1 indicates a prober according to the present invention, the reference numeral 2 indicates a housing of the prober 1, the reference numeral 3 indicates a chuck stage, and the reference numeral 4 indicates a chuck cover conductor. The chuck cover conductor 4 comprises a bottom conductor 4b and a side conductor 4s and has an open top. The reference numeral 5 indicates an insulator placed between the chuck stage 3 and the chuck cover conductor 4. As shown in the figure, the height of the side conductor 4s of the chuck cover conductor 4 is set so that the top edge of the side conductor 4s is positioned above the top face of the chuck stage 3. In the illustrated state, the chuck stage 3 together with the insulator 5 are fit and contained in the space formed by the bottom conductor 4b and the side conductor 4s of the chuck cover conductor 4.

The reference numeral 6 indicates an insulating plate, the reference numeral 7 indicates a heat-insulating plate, and the reference numeral 8 indicates a XYZ-θ stage. The heat-insulating plate 7, the insulating plate 6, the chuck cover conductor 4, and the insulator 5 are placed on the XYZ-θ stage 8 and can be moved together with the chuck stage 3 in XYZ direction as well as in θ direction by the XYZ-θ stage 8. On the upper surface of the chuck stage 3, the later described wafer holding area and probe contact area are provided. A wafer W that is a subject of the inspection is placed and held on the wafer holding area.

The reference numeral 9 indicates an upper cover conductor. The upper cover conductor 9 is attached to the housing 2 via an insulator 10. The reference numeral 11 indicates a probe for front-side electrodes, the reference numeral 12 indicates a probe for back-side electrodes, and the reference numeral 13 indicates a measurement device. The probe 11 for front-side electrodes comprises the contact member 11A, whose edge contacts front surface electrodes of semiconductor devices formed on a wafer W, and the conducting support member 11B, which is connected to and support the contact member 11A. The conducting support member 11B is connected to the measurement device 13 via an electrical connection line 16. The reference numeral 14 indicates an outer conductor, which has the conducting support member 11B and the electrical connection line 16 as inner conductors. The outer conductor 14, the conducting support member 11B, and the electrical connection line 16 constitutes a coaxial line.

On the other hand, the probe 12 for back-side electrodes comprises the contact member 12A, whose edge contacts the probe contact area formed on the upper surface of the chuck stage 3, and the conducting support member 12B. The conducting support member 12B is connected to the measurement device 13 via an electrical connection line 17. The reference numeral 15 is an outer conductor, which has the conducting support member 12B and the electrical connection line 17 as inner conductors. The outer conductor 15, the conducting support member 12B, and the electrical connection line 17 constitutes a coaxial line.

The reference 12C indicates an inductance cancel bar, which is composed of conductive material. An end of the inductance cancel bar 12C is connected to the contact member 12A, while another end of the inductance cancel bar 120 is connected to the conducting support member 12B. In addition, the inductance cancel bar is placed in parallel to the upper surface of the chuck stage 3. The reference numeral 18 indicates a supporting insulator, which is placed between the top surface of the contact member 12A of the probe 12 for back-side electrodes and the bottom surface of the upper cover conductor 9. The supporting insulator 18 supports and fixes the contact member 12A at the bottom surface of the upper cover conductor 9.

Figure 2:
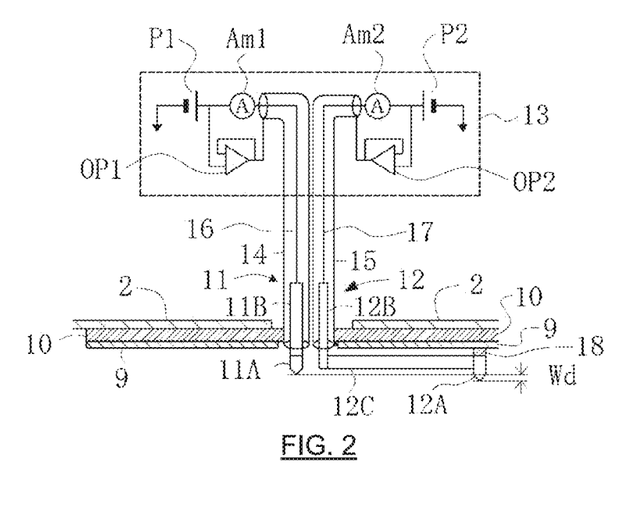
FIG. 2 is a view showing a part of FIG. 1.

FIG. 2 is a partial cross section view that shows a part of FIG. 1 only around the probe 11 for front-side electrodes and the probe 12 for back-side electrodes and the measurement device 13. As shown in the figure, the tip of the contact member 11A of the probe 11 for front-side electrodes is positioned at a distance Wd, which is equal to the thickness of the wafer W that is placed on the wafer holding area, above the tip of the contact member 12A of the probe 12 for back-side electrodes. Accordingly, when the XYZ-θ stage 8 is moved upwards and thereby the chuck stage 3 is ascended relative to the probe 11 for front-side electrodes and the probe 12 for back-side electrodes, the tip of the contact member 11A of the probe 11 for front-side electrodes and the tip of the contact member 12A of the probe 12 for back-side electrodes contact a front surface electrode of semiconductor devices formed on the wafer W and the probe contact area of the chuck stage 3, respectively, almost at the same time.

The measurement device 13 comprises power supplies P1 and P2, ammeters Am1 and Am2, and operational amplifiers OP1 and OP2. The operational amplifier OP1 forms a voltage follower circuit, whose output is connected to the outer conductor 14 of the probe 11 for front-side electrodes. The operational amplifier OP2 forms another voltage follower circuit, whose output is connected to the outer conductor 15 of the probe 12 for back-side electrodes. Accordingly, the same voltage is applied to the probe 11 for front-side electrodes and the outer conductor 14 of the probe 11, thereby keeping the both at the same potential. At the same time, the same voltage is applied to the probe 12 for back-side electrodes and the outer conductor 15 of the probe 12, thereby keeping the both at the same potential.

Although in this example, the measuring device 13 is a measuring device that measures current by applying voltage to semiconductor devices, the measuring device that may be connected to the prober 1 of the present invention is not limited to such a measuring device that measures current by applying voltage to semiconductor devices. It may be a measurement device that measures voltage by applying current to semiconductor devices, or LCR meter may be used as a measuring device 13 to measure capacitance and etc. A measurement device may be any type of device as long as there exists at least a means that keeps the probe 12 for back-side electrodes and the outer conductor 15 at the same potential by applying the same voltage to the both. Such method may be present in the measuring device 13, or may be provided apart from the measuring device 13.

As mentioned later, the outer conductor 15 is electrically continuous with the upper cover conductor 9 and the chuck cover conductor 4, and the contact member 12A of the probe 12 for back-side electrodes contacts the probe contact area of the chuck stage 3. Therefore, when the probe 12 for back-side electrodes and the outer conductor 15 are placed at the same potential, the chuck stage 3 and the upper cover conductor 9 and the chuck cover conductor 4 that cover the chuck stage 3 are placed at the same potential. Accordingly, the upper cover conductor 9 and the chuck cover conductor 4 work as a guard or shield.

Figure 3:
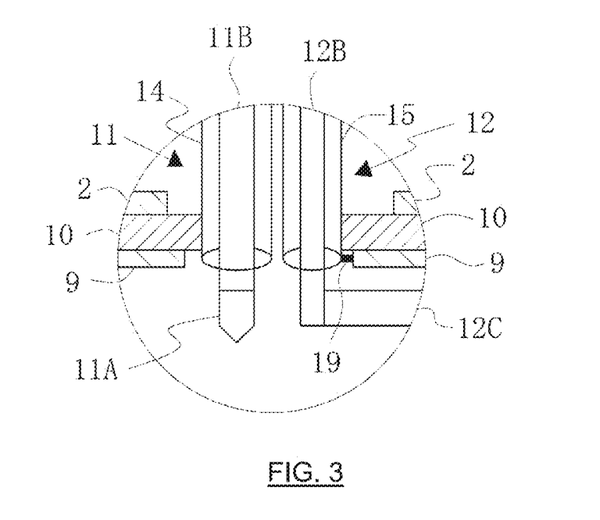
FIG. 3 is a partial enlarged view showing a part of FIG. 2.

FIG. 3 is a partial enlarged view showing a part of FIG. 2. In FIG. 3, the reference numeral 19 indicates a connecting conductor, which connects the outer conductor 15 of the probe 12 for back-side electrodes and the upper cover conductor 9 to make the both electrically continuous.

What should be placed at the same potential as that of the upper cover conductor 9 is an outer conductor of a probe for back-side electrodes. Accordingly, if the probe 11 for front-side electrodes is used as a probe for back-side electrodes, the outer conductor 14 of the probe 11 may be made electronically continuous with the upper cover conductor 9 using a connecting conductor.

Figure 4:
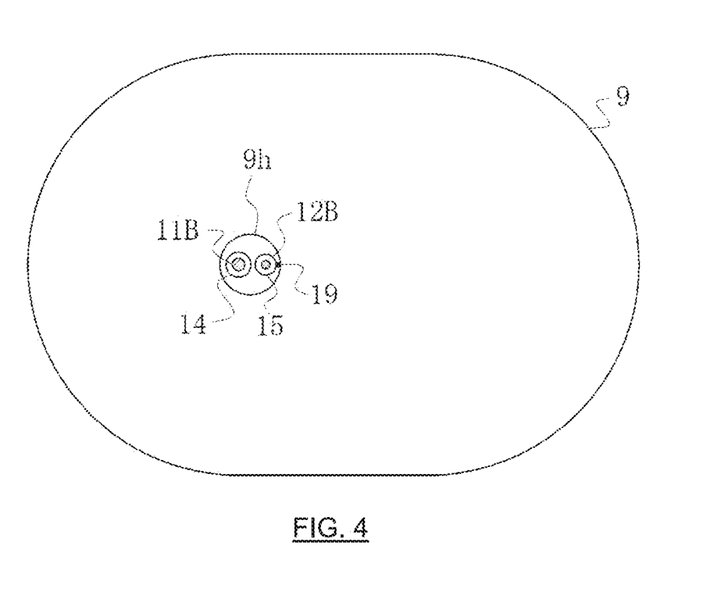
FIG. 4 is a plane view of X-X' cross section of FIG. 1.

FIG. 4 is a plane view of the X-X' cross section of FIG. 1, which is sectioned along with the X-X' line between the insulator 10 and the upper cover conductor 9, and which is equivalent to a plane view of the upper cover conductor 9. As shown in FIG. 4, the upper cover conductor 9 has the opening 9h through which the conducting support member 11B of the probe 11 for front-side electrodes and the conducting support member 12B of the probe 12 for back-side electrodes can be passed. The probe 11 for front-side electrodes and the probe 12 for back-side electrodes may be arranged so that the conducting support member 11B and 12B of the probe 11 for front side electrodes and the probe 12 for back side electrodes, respectively, pass through the upper cover conductor 9, or so that the electrical connection lines 16 and 17 that are connected to the conducting support member 11B and 12B, respectively, pass through the upper cover conductor 9.

As the outer conductor 15 is to be connected to the upper cover conductor 9 via the connecting conductor 19, the lower edge of the outer conductor 15 preferably extends at least to the height at which the upper cover conductor 9 is present. Although, in the illustrated example, the lower edges of the outer conductor 14 and 15 reach only to the near central position in the thickness direction of the upper cover conductor 9, the lower edges of the outer conductor 14 and 15 may be positioned below the bottom of the upper cover conductor 9, by passing through the opening 9h of the upper cover conductor 9.

Figure 5:
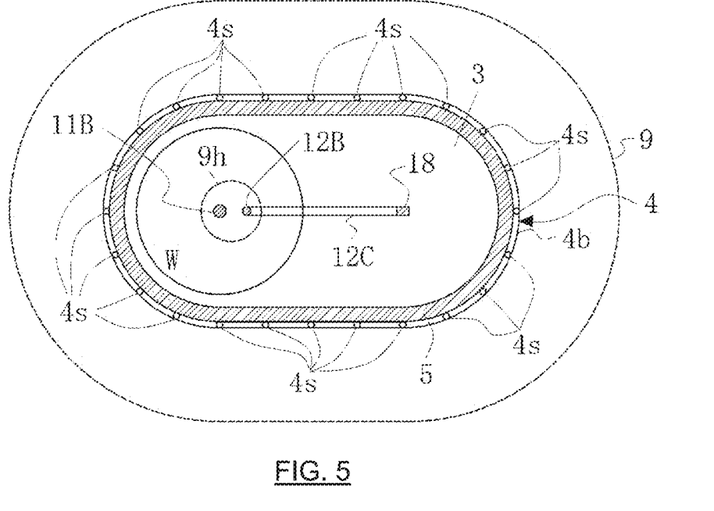
FIG. 5 is a plane view of Y-Y' cross section of FIG. 1.

FIG. 5 is a plane view of the Y-Y' cross section of FIG. 1. For convenience, the upper cover conductor 9 and the opening 9h are depicted by the dashed line. As shown in FIG. 5, the chuck stage 3 has a racetrack planar shape that is formed by joining a rectangle with two semicircles at the both ends of the rectangle. The chuck cover conductor 4 comprises a bottom conductor 4b and side conductors 4s. Similarly to the chuck stage 3, the bottom conductor 4b has a racetrack planar shape that is formed by joining a rectangle with two semicircles at the both ends of the rectangle, which is however slightly larger than the chuck stage 3.

Figure 6:
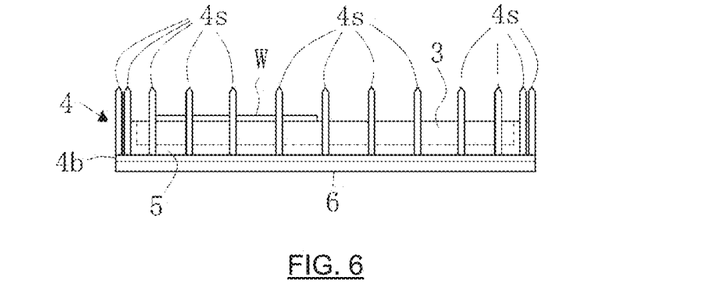
FIG. 6 is a front view of the chuck cover conductor.

FIG. 6 is a front view of FIG. 5. As shown in FIG. 5 and FIG. 6, the side conductors 4s have a bar shape and placed upright along with the edge of the bottom conductor 4b of the chuck cover conductor 4 so that the chuck stage 3 is surrounded. The top parts of the side conductors 4s have a pogo pin structure, which is energized upwards by a built-in elastic means, such as spring.

In the above example, the side conductors 4s are bar-shaped members that are placed along with the edge of the bottom conductor 4b at intervals. However, the shape of the side conductor 4s is not limited to the bar shape. The side conductor may be a conductor having a continuous cylindrical shape, whose bottom is attached to the bottom conductor 4b. Meanwhile, the side conductors may be plate-shaped conductors or curved plate-shaped conductors that are placed along with the edge of the bottom conductor 4b at intervals.

FIG. 7 to FIG. 10 are plane views indicating the positional relationship between the upper cover conductor 9 and a top face opening 4T of the chuck cover conductor 4, while the contact member 11A of the probe 11 for front side electrodes is relatively moved within the upper surface of wafer W under inspection by the movement of the XYZ-θ stage 8. For convenience, the upper cover conductor 4, the wafer W, a part of the inductance cancel bar 12C and the supporting insulator 18 are depicted by the dashed line.

Figure 7:
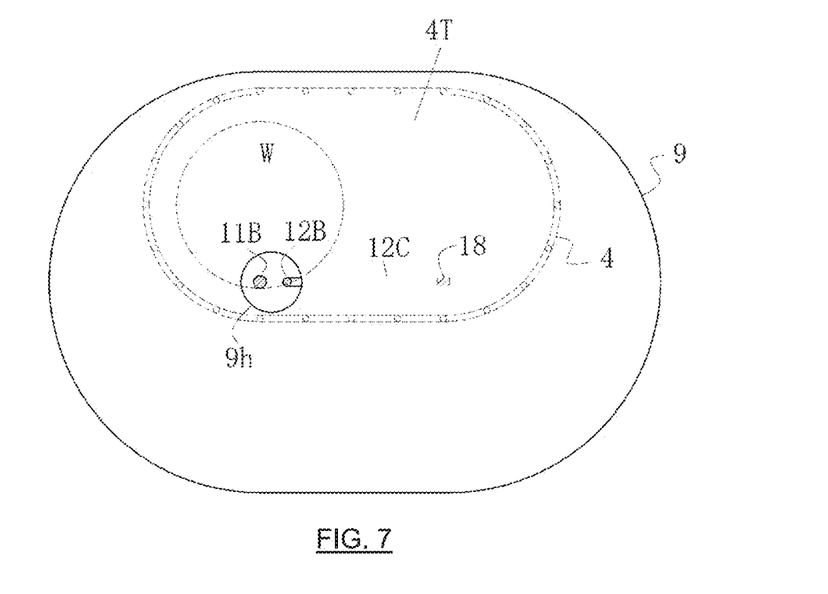
FIG. 7 is a plane view showing a positional relationship of the upper cover conductor and the open top of the chuck cover conductor when the probe for front-side electrodes relatively moves within the top surface of wafer.
Figure 8:
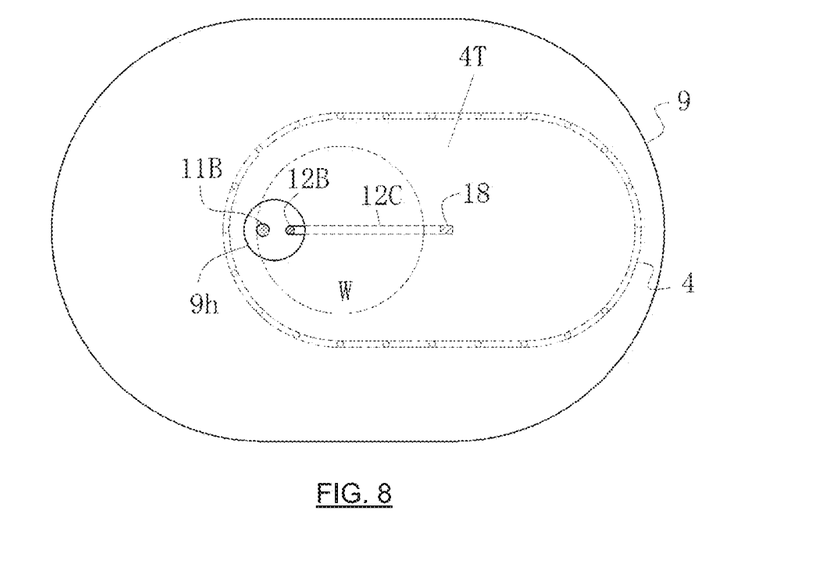
FIG. 8 is a plane view showing a positional relationship of the upper cover conductor and the open top of the chuck cover conductor when the probe for front-side electrodes relatively moves within the top surface of wafer.
Figure 9:
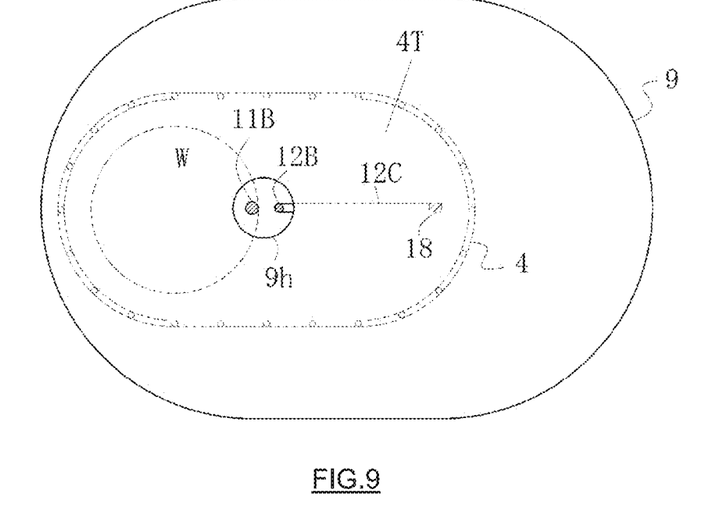
FIG. 9 is a plane view showing a positional relationship of the upper cover conductor and the open top of the chuck cover conductor when the probe for front-side electrodes relatively moves within the top surface of wafer.
Figure 10:
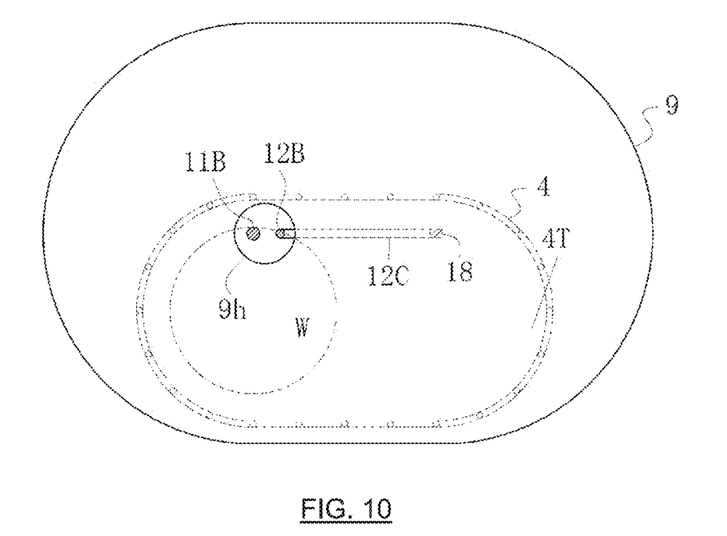
FIG. 10 is a plane view showing a positional relationship of the upper cover conductor and the open top of the chuck cover conductor when the probe for front-side electrodes relatively moves within the top surface of wafer.

FIG. 7 indicates the state when the contact member 11A of the probe 11 for front-side electrodes is relatively moved within the upper surface of the wafer W under inspection and positioned at the foremost side of the wafer in the figure. Meanwhile, FIG. 8 indicates the state when the contact member 11A is moved to the leftmost side, FIG. 9 indicates the state when the contact member 11A is moved to the rightmost side, and FIG. 10 indicates the state when the contact member 11A is moved to the farthest side. As shown in FIG. 7 to FIG. 10, the top face openings 4T of the chuck cover conductor 4 is always covered by the upper cover conductor 9 and does not go beyond the bottom of the upper cover conductor 9 in a plane view.

In other words, the size of the upper cover conductor 9 is selected so that the top face opening 4T of the chuck cover conductor 4 does not go beyond the upper cover conductor 9 in a plane view, while the contact member 11A of the probe 11 for front-side electrodes relatively moves within the upper surface of the wafer W under inspection. Accordingly, regardless of which position of the contact member 11A of the probe 11 for front-side electrodes is moved within the upper surface of the wafer W under inspection, the electrical continuity can be certainly achieved when the chuck cover conductor 4 along with the chuck stage 3 is moved relatively upwards to the upper cover conductor 9 by the movement of the XYZ-θ stage 8 and the side conductors 4s of the chuck cover conductor 4 is brought in contact with the bottom of the upper cover conductor 9.

Figure 11:
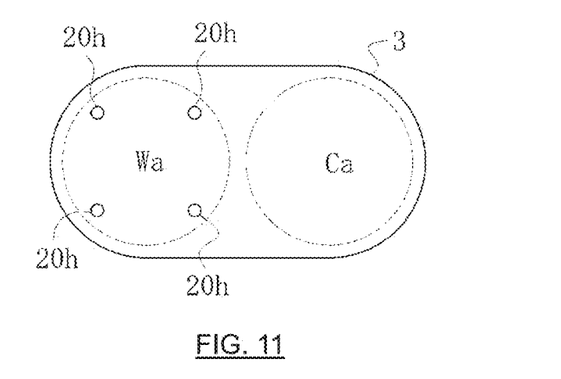
FIG. 11 is a plane view of an example of a chuck stage.

FIG. 11 is a plane view of the chuck stage 3. In the figure, the reference Wa indicates a wafer holding area present on the upper surface of the chuck stage 3, while the reference Ca indicates a probe contact area present also on the upper surface of the chuck stage 3. As shown in the figure, both the wafer holding area Wa and the probe contact area Ca are provided on the upper side of the chuck stage 3.

The references 20h indicate lift pin holes that are provided on the wafer holding area Wa on the chuck stage 3, through each of which a lift pin passes. As the chuck stage 3 is composed of conductive material, such as copper with anti-corrosion plating, the wafer holding area Wa and the probe contact area Ca are electrically continuous. Although not illustrated, the wafer holding area Wa has a large number of suction holes. When the negative pressure is applied by an appropriate suction means, a wafer to be inspected is sucked and held on the wafer holding area Wa. Typically, the wafer holding area Wa is nearly as large as the probe contact area Ca. When the contact member 11A of the probe 11 for front-side electrodes relatively moves within a wafer that is held on the wafer holding area Wa, the contact member 12A of the probe 12 for back-side electrodes relatively moves within the probe contact area Ca.

Figure 12:
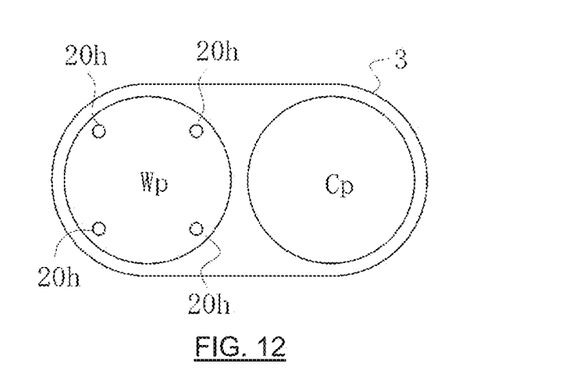
FIG. 12 is a plane view of another example of a chuck stage.
Figure 13:
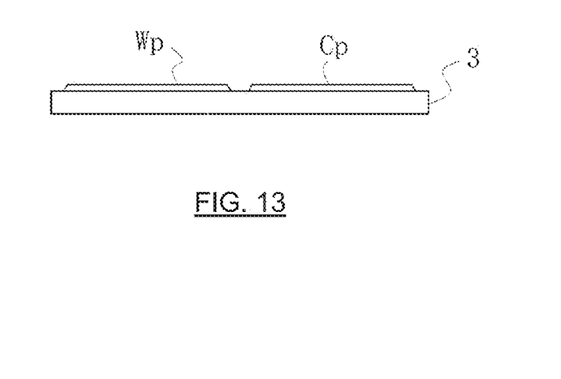
FIG. 13 is a front view of FIG. 12.

FIG. 12 is a plane view of another example of a chuck stage 3, while FIG. 13 is a front view of this another example of a chuck stage 3. In the example shown in FIG. 12 and FIG. 13, the wafer holding area Wa is provided on the upper surface of a wafer chuck plate Wp that is removably held on the chuck stage 3, while the probe contact area Ca is provided on the upper surface of a contact plate Cp that is removably held on the chuck stage 3. Both of them are placed on the upper side of the chuck stage 3.

Both of the wafer chuck plate Wp and the contact plate Cp are composed of conductive material, such as copper with anti-corrosion plating, as well as the chuck stage 3. Accordingly, the upper surface of the wafer chuck plate Wp and the upper surface of the contact plate Cp are electrically continuous via the chuck stage 3.

The references 20h indicate lift pin holes that are provided on the wafer chuck plate Wp, through each of which a lift pin passes. The lift pin holes 20h are also provided on the chuck stage 3, present below the wafer chuck plate Wp, at a position corresponding to the position of the lift pin holes 20h provided on the wafer chuck plate Wp. Although not illustrated, the wafer holding area Wa of the wafer chuck plate Wp has a large number of suction holes. When the negative pressure is applied by an appropriate suction means, a wafer to be inspected is sucked and held on the wafer holding area Wa.

When the chuck stage 3 has neither the wafer holding area Wa nor the probe contact area Ca directly formed on its upper surface but has the wafer chuck plate Wp and the contact plate Cp in addition to the chuck stage 3 and the upper surface of them are used as the wafer holding area Wp and the probe contact area Ca, respectively, as shown in FIG. 12 and FIG. 13, it is very convenient because the wafer chuck plate Wp or the contact plate Cp can be appropriately replaced with a new one even when the wafer holding area Wa or the probe contact area Ca are contaminated or impaired during use of the prober 1.

The operation of the prober 1 according to the present invention is described below by taking the case of using the prober 1 and the measurement device 13 shown in FIG. 1 as an example.

Figure 14:
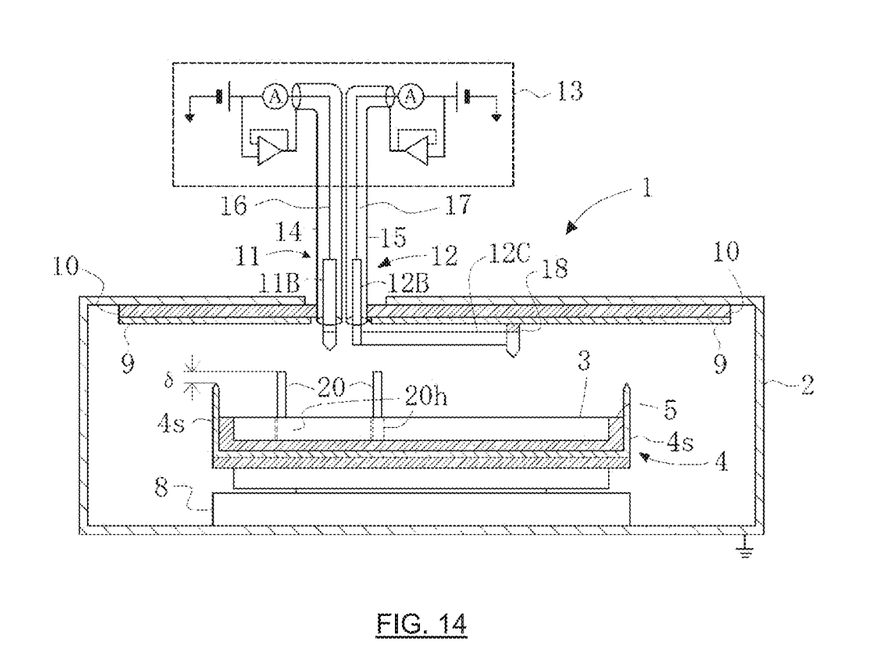
FIG. 14 is a view explaining the operation of the prober of the present invention.

FIG. 14, as well as FIG. 1, is a partial cross section of a front view of a prober 1 according to the present invention. In FIG. 14, the wafer W is not present, and the chuck stage 3 together with the chuck cover conductor 4 is descended to a lower position by the movement of the XYZ-θ stage 8. The lift pins 20 are moved by lift pin driving means (not shown) and are ascended through lift pin holes 20h provided on the chuck stage 3 and positioned at a wafer receiving position above the wafer holding area Wa of the chuck stage 3. As shown in FIG. 14, at the wafer receiving position, the top edges of the lift pins 20 are positioned at a distance δ above the top edge of the side conductor 4s of the chuck cover conductor 4.

Figure 15:
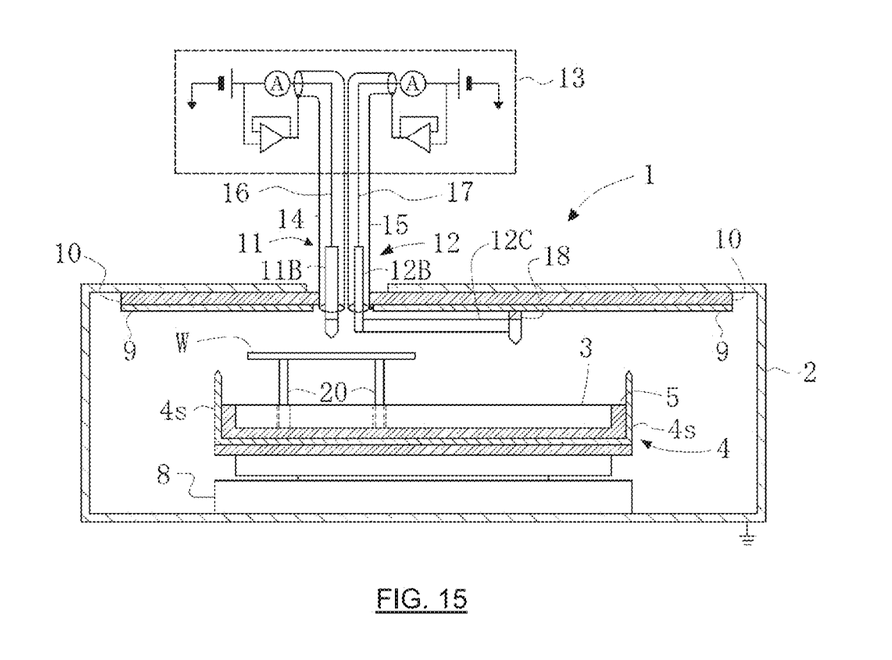
FIG. 15 is a view explaining the operation of the prober of the present invention.

FIG. 15 shows a state that the wafer W to be inspected is placed on the lift pins 20 at the wafer receiving position by the operation of the wafer conveying device (not shown) from the state shown in FIG. 14. As the top edges of the lift pins 20 are positioned above the top edge of the side conductor 4s of the chuck cover conductor 4 at the wafer receiving position, there is a distance between the bottom of the wafer W placed on the lift pins 20 and the side conductors 4s, which is enough for forks of the common wafer conveying device to pass through.

Figure 16:
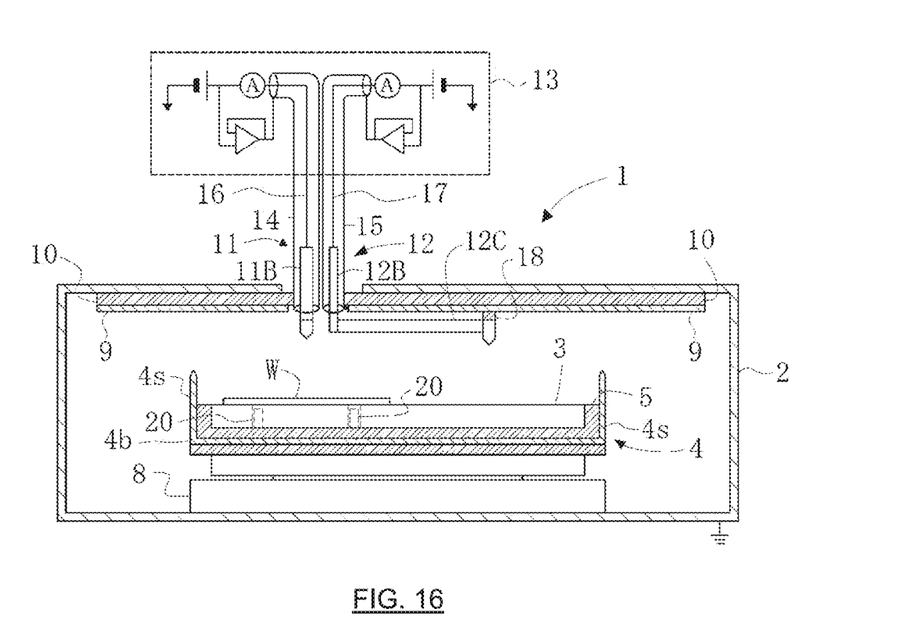
FIG. 16 is a view explaining the operation of the prober of the present invention.

FIG. 16 shows a state that the lift pins 20 are descended, by the operation of a lift pin driving means, to a standby position from the state shown in FIG. 15. As shown in FIG. 16, at the standby position, the top edges of the lift pins 20 are positioned below the wafer holding area Wa of the chuck stage 3. Accordingly, the wafer W can be placed on the wafer holding area Wa by descending the lift pins 20 to the standby position from the state that the wafer W are placed on the lift pin 20s.

When the wafer W is placed on the wafer holding area Wa, the suction means (not shown) operates and a large number of suction holes opened towards the wafer holding area Wa are sucked and the negative pressure is applied, thereby sucking and holding the wafer W placed on the wafer holding area Wa.

Figure 17:
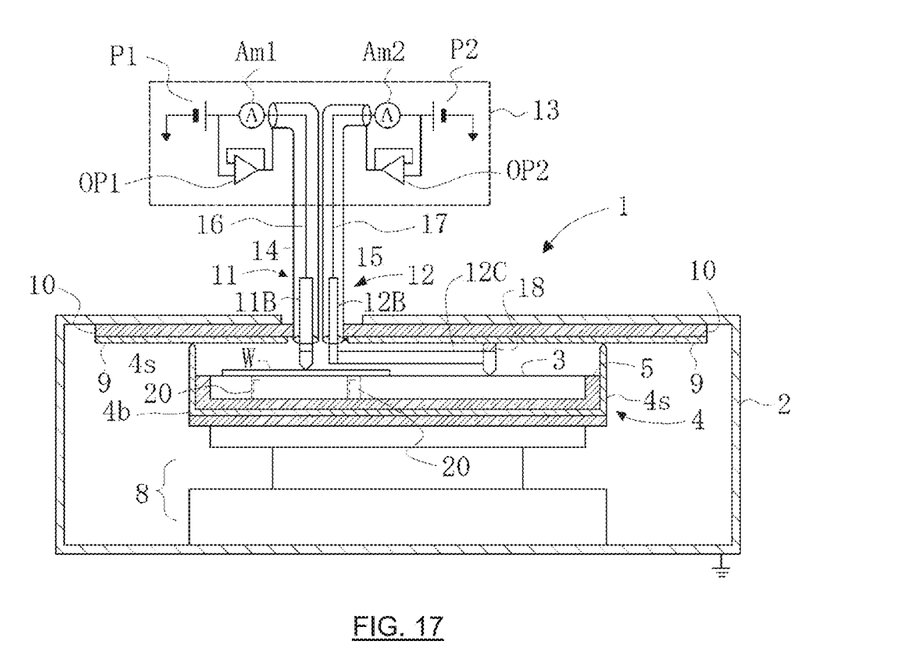
FIG. 17 is a view explaining the operation of the prober of the present invention.

FIG. 17 shows a state that the chuck stage 3 is ascended towards the probe 11 for front-side electrodes and the probe 12 for back-side electrodes by operation of the XYZ-θ stage 8 from the state shown in FIG. 16, where the contact member 11A of the probe 11 for front-side electrodes is in contact with the surface electrode of the semiconductor device formed on the wafer W and the contact member 12B of the probe 12 for back-side electrodes is in contact with the probe contact area Ca on the chuck stage 3. At this time, the chuck cover conductor 4 that is also on the XYZ-θ stage 8 is ascended as well as the chuck stage 3, thereby the top edge of the side conductor 4s is brought in contact with the bottom surface of the upper cover conductor 9. Because the top part of the side conductor 4s is equipped with the contactor which is elastically energized upwards and having, for example, a pogo pin structure, the contact and the sufficient electrical continuity between the top edge of the side conductor 4s and the bottom surface of the upper cover conductor 9 are ensured.

Figure 18:
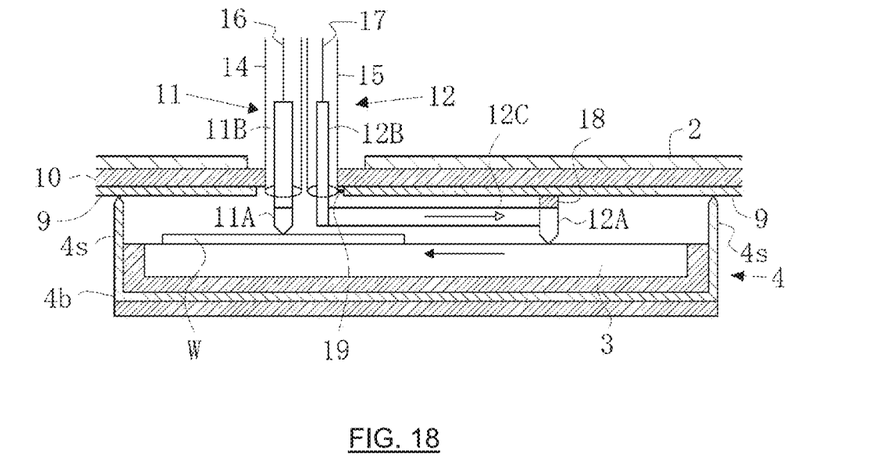
FIG. 18 is an enlarged view showing a part of FIG. 17.

In this state, the measurement device 13 operates and conducts a necessary inspection and measurement, by applying a necessary electrical signal to the probe 12 for back-side electrodes and measuring an electrical signal that is returned from the probe 11 for front-side electrodes. At the same time, the voltage, which is as large as the electrical potential applied to the electrical connection line 17 of the probe 12 for back-side electrodes through the operational amplifier OP2 that forms a voltage follower circuit, is applied to the outer conductor 15 of the probe 12 for back-side electrodes. FIG. 18 is a view that enlarges and shows the main of the prober 1 in this state.

As shown in FIG. 18, the voltage applied to the electrical connection line 17 of the probe 12 for back-side electrodes is applied to the chuck stage 3 via the supporting conductor 12B of the probe 12 for back-side electrodes, the inductance cancel bar 12C, and the contact member 12A. On the other hand, as the outer conductor 15 and the upper cover conductor 9 are electrically continuous through the connecting conductor 19, and as the bottom surface of the upper cover conductor 9 and the side conductor 4s of the chuck cover conductor 4 are in the electrically contacted state, the upper cover conductor 9, the chuck cover conductor 4, and the outer conductor 15 are placed in the same potential as well as the chuck stage 3.

Accordingly, the chuck cover conductor 4 and the upper cover conductor 9 which surrounds the chuck stage 3 work as the guard or shield with respect to the chuck stage 3, reducing the influence of the external noises or the leakage of the current through the chuck stage 3, and at the same time eliminating the stray capacitance between the chuck stage 3 and the housing 2 of the prober 1. Thereby, the very accurate measurement and inspection can be carried out.

As explained above, in the prober 1 according to the present invention, the outer conductor 15 of the probe 12 for back-side electrodes is electrically connected to the upper cover conductor 9 and the chuck cover conductor 4 through the connecting conductor 19 with the shortest path length, providing an advantage that the guard or shield can be achieved while suppressing the stray capacitance generated in connection path to the minimum.

As shown in FIG. 18 using the white arrow and the black arrow, during measurement, the current flowing through the inductance cancel bar 12C and the current flowing through the chuck stage 3 flow in opposite directions. However, as the inductance cancel bar 120 is placed in parallel to the upper surface of the chuck stage 3, the magnetic field generated by the current flowing through the chuck stage 3 is offset by the magnetic field generated by the current flowing through the inductance cancel bar 12C, which flows in the opposite direction to the current flowing through the chuck stage 3. Accordingly, the effective inductance in the current path between the contact member 11A of the probe 11 for front-side electrodes and the contact member 12A of the probe 12 for back-side electrodes can be reduced, thereby enabling the more accurate measurement.

Because the contact member 12A of the probe 12 for back-side electrodes, which is connected to the inductance cancel bar 120, is supported to the upper cover conductor 9 by the supporting insulator 18 between them, even after being repeatedly brought into contact with the probe contact area Ca, the height position of the edge of the contact member 12A is not likely to be changed and the contact member 12A can always keep the constant height position.

Therefore, the contact member 12A can be brought into contact with the probe contact area Ca in a constant and stable contact condition. Furthermore, because the contact member 12A is supported to the upper cover conductor 9 by the supporting insulator 18 between them and is held stably at the constant height position, the inductance cancel bar 120 that is connected to the contact member 12A is also stably held at the constant height position at a connection part at which the inductance cancel bar 12C and the contact member 12A are connected. Therefore, the parallel relationship between the inductance cancel bar 120 and the upper surface of the chuck stage 3 remains unchanged, and accordingly the function as an inductance cancel bar is not likely to be impaired.

In the above explanation, the chuck stage 3 has a racetrack planar shape that is formed by joining a rectangle with two semicircles at the both ends of the rectangle. However, the planar shape of the chuck stage 3 is not limited to this example. For example, the planar shape of the chuck stage 3 may be rectangle, polygon, and ellipse, or it may also be other shapes. In the above explanation, both of the wafer holding area Wa and the probe contact area Ca are provided as partial regions that occupy a part of the continuous and conductive upper surface of the chuck stage 3, but are not limited thereto. For example, although the wafer holding area Wa and the probe contact area Ca are integrally and continuously formed in their alignment direction in the above described chuck stage 3, a part of the region between the wafer holding area Wa and the probe contact area Ca may be lacked and the wafer holding area Wa and the probe contact area Ca may be partially continuous. Meanwhile, the portion containing the wafer holding area Wa and the portion containing the probe contact area Ca may be formed separately and then electrically connected by joining the two portions or by bridging between the two portions using one or more conducting members. On the other hand, there may be an insulating region between the wafer holding area Wa and the probe contact area Ca. In such a case, the electrically independent wafer holding area Wa and the probe contact area Ca may be made electrically connected at one or more places.

INDUSTRIAL APPLICABILITY

As explained above, in accordance with the prober of the present invention, the guard or shield that surrounds the chuck stage can be achieved while keeping the connecting path very short. Therefore, the influence of the external noise or the leakage of the current can be reduced and the stray capacitance of the chuck stage against the prober housing can be eliminated, so that the accurate measurement and inspection can be carried out. The present invention possesses great industrial applicability.

EXPLANATION OF SYMBOLS

1 Prober
2 Housing
3 Chuck Stage
4 Chuck Cover Conductor
5, 10 Insulator
8 XYZ-θ stage
9 Upper Cover Conductor
11 Probe for Front-Side Electrodes
12 Probe for Back-Side Electrodes
13 Measurement Device
14, 15 Outer Conductor
16, 17 Electrical Connection Line
18 Supporting Insulator
19 Connecting Conductor
20 Lift Pin
W Wafer
Wa Wafer Holding Area
Ca Probe Contact Area
Wp Wafer Chuck Plate
Cp Contact Plate

The invention claimed is:

1. A prober which comprises the following (1) to (9):
   (1) a chuck stage that comprises a conductive wafer holding area and a conductive probe contact area on the upper side of the chuck stage, wherein the conductive probe contact area is electrically continuous with the wafer holding area;
   (2) a probe for front-side electrodes and a probe for back-side electrodes placed above the upper surface of the chuck stage, each of which comprises a conducting support member and a contacting member that is electrically connected to the conducting support member;
   (3) an inductance cancel bar that is a conductive bar that connects between the conducting support member and the contacting member of the probe for front-side electrodes or between the supporting conductive member and the contacting member of the probe for back-side electrodes, which is placed parallel to the upper surface of the chuck stage;
   (4) a moving means that moves the chuck stage relative to the probe for front-side electrodes and the probe for back-side electrodes;
   (5) a chuck cover conductor that comprises a bottom conductor and a side conductor and an open top, wherein the chuck stage can be contained within a space surrounded by the bottom conductor and the side conductor;
   (6) an upper cover conductor, which is placed above the inductance cancel bar and is attached to a housing of the prober via an insulator, which has an opening through which the conducting support members of the probe for front-side electrodes and the probe for back-side electrodes or electrical connection lines connected to the probe for front-side electrodes and the probe for back-side electrodes can be passed, and which is large enough to cover, in a plane view, at least the open top of the chuck cover conductor when the contact member of the probe for front-side electrodes moves relatively within a wafer under inspection by the moving means during inspection;
   (7) a conducting means that brings the chuck cover conductor and the upper cover conductor into contact and makes them electrically continuous;
   (8) an outer conductor that surrounds the conducting support member of the probe for back-side electrodes and has the conducting support member as an inner conductor, the outer conductor being electrically continuous with the upper cover conductor; and
   (9) a voltage follower circuit configured to keep the probe for back-side electrodes and the outer conductor at the same potential.

2. The prober of claim 1, wherein the conducting means that brings the chuck cover conductor and the upper cover conductor into contact and makes them electrically continuous is the moving means, and wherein the conducting means is a means that moves the chuck cover conductor together with the chuck stage relatively upwards or downwards and thereby brings the chuck cover conductor and the upper cover conductor into contact, by moving the chuck stage upwards or downwards relative to the probe for front-side electrodes and the probe for back-side electrodes.

3. The prober of claim 2, wherein the chuck cover conductor has a contactor at the point at which the chuck cover conductor contacts the upper cover conductor, and wherein the contactor is elastically energized towards the upper cover conductor when in contact with the upper cover contactor.

4. The prober of claim 1, wherein the contacting member of the probe for front-side electrodes or the probe for back side-electrodes, which comprises the inductance cancel bar between the contacting member and the conducting support member, is supported to the upper cover conductor by another insulator between the contacting member and the upper cover conductor.

5. The prober of claim 1, which further comprises multiple lift pins that lift up a wafer above the wafer holding area, and a lift pin driving means that moves the lift pins upwards and downwards in a space between the position below the wafer holding area of the chuck stage and the position above the top edge of the side conductor of the chuck cover conductor, and wherein the chuck stage has lift pin holes which the lift pins pass through.

6. A prober which comprises the following (1) to (7):
(1) a chuck stage that comprises a conductive wafer holding area and a conductive probe contact area on the upper side of the chuck stage, wherein the conductive probe contact area is electrically continuous with the wafer holding area;
(2) a probe for front-side electrodes and a probe for back-side electrodes placed above the upper surface of the chuck stage, each of which comprises a conducting support member and a contacting member that is electrically connected to the conducting support member;
(3) an inductance cancel bar that is a conductive bar that connects between the conducting support member and the contacting member of the probe for front-side electrodes or between the supporting conductive member and the contacting member of the probe for back-side electrodes, which is placed parallel to the upper surface of the chuck stage;
(4) a moving means that moves the chuck stage relative to the probe for front-side electrodes and the probe for back-side electrodes;
(5) a chuck cover conductor that comprises a bottom conductor and a side conductor and an open top, wherein the chuck stage can be contained within a space surrounded by the bottom conductor and the side conductor;
(6) an upper cover conductor, which is placed above the inductance cancel bar, which has an opening through which the conducting support members of the probe for front-side electrodes and the probe for back-side electrodes or electrical connection lines connected to the probe for front-side electrodes and the probe for back-side electrodes can be passed, and which is large enough to cover, in a plane view, at least the open top of the chuck cover conductor when the contact member of the probe for front side electrodes moves relatively within a wafer under inspection by the moving means during inspection; and
(7) a conducting means that brings the chuck cover conductor and the upper cover conductor into contact and makes them electrically continuous;
wherein the contacting member of the probe for front-side electrodes or the probe for back side-electrodes, which comprises the inductance cancel bar between the contacting member and the conducting support member, is supported to the upper cover conductor by an insulator between the contacting member and the upper cover conductor.

7. The prober of claim 6, wherein the conducting support member of the probe for back-side electrodes has, around its surroundings, an outer conductor that has the conducting support member as an inner conductor, and wherein the outer conductor is electrically continuous with the upper cover conductor.

8. The prober of claim 6, wherein the conducting means that brings the chuck cover conductor and the upper cover conductor into contact and makes them electrically continuous is the moving means, and wherein the conducting means is a means that moves the chuck cover conductor together with the chuck stage relatively upwards or downwards and thereby brings the chuck cover conductor and the upper cover conductor into contact, by moving the chuck stage upwards or downwards relative to the probe for front-side electrodes and the probe for back-side electrodes.

9. The prober of claim 8, wherein the chuck cover conductor has a contactor at the point at which the chuck cover conductor contacts the upper cover conductor, and wherein the contactor is elastically energized towards the upper cover conductor when in contact with the upper cover contactor.

10. The prober of claim 6, which further comprises multiple lift pins that lift up a wafer above the wafer holding area, and a lift pin driving means that moves the lift pins upwards and downwards in a space between the position below the wafer holding area of the chuck stage and the position above the top edge of the side conductor of the chuck cover conductor, and wherein the chuck stage has lift pin holes which the lift pins pass through.

* * * * *